US012800654B2

(12) United States Patent
Sachdev

(10) Patent No.: US 12,800,654 B2
(45) Date of Patent: Nov. 17, 2026

(54) SYSTEM FOR AND METHOD OF IMPROVING THE YIELD OF INTEGRATED CIRCUITS

(71) Applicant: ZINITE CORPORATION, Vancouver (CA)

(72) Inventor: Manoj Sachdev, Edmonton (CA)

(73) Assignee: ZINITE CORPORATION, Edmonton (CA)

( * ) Notice: Subject to any disclaimer, the term of this patent is extended or adjusted under 35 U.S.C. 154(b) by 286 days.

(21) Appl. No.: 18/425,567

(22) Filed: Jan. 29, 2024

(65) Prior Publication Data

US 2024/0264227 A1 Aug. 8, 2024

Related U.S. Application Data

(60) Provisional application No. 63/443,517, filed on Feb. 6, 2023.

(51) Int. Cl.
*G01R 31/28* (2006.01)
*G01R 31/317* (2006.01)
*G01R 31/3177* (2006.01)

(52) U.S. Cl.
CPC ... *G01R 31/31704* (2013.01); *G01R 31/2882* (2013.01); *G01R 31/31725* (2013.01); *G01R 31/31727* (2013.01); *G01R 31/3177* (2013.01)

(58) Field of Classification Search
CPC ............ G01R 31/2841; G01R 31/2882; G01R 31/317; G01R 31/31704; G01R 31/31725; G01R 31/31727
See application file for complete search history.

(56) References Cited

U.S. PATENT DOCUMENTS 9,520,876 B1 * 12/2016 Chadwick .......... H03K 19/0016
2003/0146454 A1 8/2003 Sasaki et al.
2007/0143718 A1 6/2007 Abercrombie et al.
2014/0223210 A1 * 8/2014 Bucelot .................... G06F 1/10 713/322

FOREIGN PATENT DOCUMENTS

EP 1886159 A2 2/2008
WO PCT/IB2024/050635 1/2024

* cited by examiner

*Primary Examiner* — Douglas X Rodriguez
*Assistant Examiner* — Kendrick X Liu
(74) *Attorney, Agent, or Firm* — Perry + Currier Inc.

(57) ABSTRACT

A system and method to increase the yield of manufactured integrated circuits by providing remedial circuit elements including alternate plane transistors, manufactured by middle of line and/or back end of line processes, to enable and disable the remedial circuit elements which provide additional circuit functions, when needed, as determined by post-manufacture testing of the integrated circuits and/or by in-operation monitoring of circuit operation. The system and method can address the distribution of the power supply and signals, such as clock signals, and/or high speed I/O signals, through problem areas resulting from sub-optimal designs, circuit aging and/or failures due to manufacturing process variations.

28 Claims, 7 Drawing Sheets

SYSTEM FOR AND METHOD OF IMPROVING THE YIELD OF INTEGRATED CIRCUITS

FIELD OF THE INVENTION

The present invention relates to a system for and method of improving the yield in the manufacture of integrated circuits. More particularly, the present invention relates to employing alternate plane transistors and circuit elements to enhance performance of and/or to correct erroneous behavior in integrated circuits.

BACKGROUND OF THE INVENTION

Semiconductor manufacturers refer to Moore's Law to describe the ongoing reduction in size, and corresponding density increase, of semiconductor components such as transistors, interconnects, etc. on integrated circuits. Moore's Law states that roughly every two years, the number of transistors on a chip die will double.

To achieve this scale of increase, much technological effort is made to shrink the size of the components making up the semiconductor integrated circuit. Yet, despite the significant decreases in component sizes, the overall size of many integrated circuits has still grown significantly, resulting in larger die sizes, as more features and capabilities are added to devices. For example, the Apple M1 processor used in some Apple devices reportedly has 11.8 billion transistors, and a die size of about 120 square mm, while the Apple M1Max processor reportedly has 57 Billion transistors and a die size of about 490 square mm. Other advanced semiconductor devices have similar numbers of transistors and die sizes.

This combination of smaller components on larger dies poses many challenges to semiconductor designers and manufacturers. In fact, a significant proportion of manufactured devices will not operate properly, or will not operate at a desired speed, due to a variety of factors, including: even minute undesired variations in the processes used to manufacture them; overly optimistic design rules employed in the software used to design the circuits resulting in deficient designs; circuit designer errors; etc.

Accordingly, the yield (the percentage of manufactured devices which operate within specified parameters of acceptance, as determined by post-manufacture testing) for the manufacture of these semiconductor devices is typically lower than desired. In the case of integrated circuits whose designs are at the limit of fabrication technologies, the yield can be much, much lower than is desired. Lower yields mean the manufacturer's profits are reduced and the supply of such advanced devices may be less than desired.

SUMMARY OF THE INVENTION

It is an object of the present invention to provide a novel method and system of increasing the yield of manufactured integrated circuits which obviates or mitigates at least one disadvantage of the prior art.

According to a first aspect of the present invention, there is provided a system for increasing the yield of manufactured integrated circuits, each integrated circuit comprising: a designed set of circuits implemented as front end of line manufactured circuit elements, including at least one front end of line circuit element which is a remedial element; at least one transistor manufactured as an alternate plane transistor and operable to selectively activate or deactivate, post manufacture of the integrated circuit, the at least one remedial front end of line circuit element in accordance with the result of a test performed on the integrated circuit.

Preferably, the remedial circuit element comprises an additional buffer to strengthen a signal at the at least one front end element. Also preferably, the system further includes a programmable memory element to control the selective activation and deactivation of the at least one remedial front end of line circuit element.

In accordance with another aspect of the present invention, there is provided an integrated circuit comprising: at least two circuits each circuit designed to implement a function, where a first one of the at least two circuits is designed to implement an optional function; at least one alternate plane transistor operable to selectively enable and disable the first one of the at least two circuits; and a programmable means to control the at least one alternate plane transistor to enable and disable the first one of the at least two circuits.

In accordance with another aspect of the present invention, there is provided a method of manufacturing an integrated circuit, comprising the steps of: designing the necessary circuits to implement the desired functions of the integrated circuit; reviewing the design of the necessary circuits to determine areas which can have operating issues due to manufacturing process variations; adding remedial elements to the design of the necessary circuits to provide remedial circuit capabilities at the determined areas; performing front end of line manufacturing of the designed integrated circuit; for at least each determined area, manufacturing an alternate plane transistor, the alternate plane transistor being operable to selectively enable and disable the remedial circuit in the determined area; completing the manufacturing processes to obtain a completed integrated circuit; and testing the completed integrated circuit to identify the specified areas which do not meet predefined test criteria for the determined area and, for each identified specified area, programming the transistors associated with each identified specified area to enable the respective remedial element.

Preferably, the testing of the completed integrated circuit is performed dynamically with the circuit in operation.

In accordance with yet another aspect of the present invention, there is provided a method of increasing the yield when manufacturing integrated circuits, comprising the steps of: designing a MOS logic integrated circuit; determining at least one possible point of circuit failure in the designed MOS logic integrated circuit; modifying the design of the MOS logic integrated circuit by adding a remedial element to the design of the MOS Logic integrated circuit at the determined at least one possible point of failure, the remedial element to be located on a plane of the MOS logic integrated circuit other than a plane of the MOS Logic integrated circuit on which the MOS logic is located; manufacturing the MOS logic integrated circuit using the modified design; testing the manufactured integrated circuit to determine if the at least one possible point of failure is a point of failure to detect if the at least one possible point of failure is a point of failure; and connecting the remedial element to the determined point of failure in the manufactured MOS logic to correct the failure.

Preferably, the remedial element is connected to the determined point of failure through a transistor formed on the plane of the MOS logic integrated circuit other than a plane on which the MOS logic is located.

The present invention provides a system and method to increase the yield of manufactured integrated circuits by providing transistors manufactured on an alternate plane of a die to enable and disable redundant circuit elements which provide additional circuit functions when needed, as determined by post-manufacture testing of the integrated circuits or as dynamically determined during operation of the integrated circuit.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

As briefly discussed above, the ongoing trend of reducing the size of circuit components in an integrated circuit, while increasing the number of circuit elements and the size of the die on which the circuit they make up is formed, leads to challenges in manufacturing correctly operating instances of those integrated circuits.

The present invention addresses these challenges through the provision of remedial circuit elements, which are fabricated on a plane of the integrated circuit other than the plane on which MOS logic is conventionally formed. As described below, these remedial elements are capable of addressing one or more common causes of circuit failure and are able to be switched into, or in some cases, out of the MOS logic circuitry as needed.

One common example of a challenge in the design of modern integrated circuit systems is the issue of clocking the system. A typical digital synchronous system critically depends on a periodic signal called a clock ("CLK") being available across the entire circuit for the circuit's fault-free operation. For example, system memory storage elements, such as registers and latches, are typically updated on the arrival of the CLK signal.

A typical ideal clock signal is a square wave, and system elements typically respond to either the rising side (positive going) or the falling side (negative going) of the square wave pulse. For example, a register can be designed to update its output at the arrival of the positive going edge of the CLK signal. Ideally, this clock edge must arrive at precisely the same time over the entire system of the integrated circuit or unintended operations, including erroneous outputs, race conditions, etc. can occur. Ensuring the distribution and substantially simultaneous arrival of clock signals is a significant challenge when designing modern integrated circuits.

A specifically designed clock distribution network, called a Clock Tree ("CT"), is often designed and employed to provide the clock signal across the integrated circuit and to limit the movement (aka, clock skew) of the clock signal edges away from their ideal arrival time.

Sometimes an alternative clock distribution network, called a Clock Mesh ("CM") is also implemented. While it is generally accepted that, compared to a Clock Tree, a Clock Mesh has better skew management, Clock Meshes have a higher power consumption, and require larger amounts of area on the chip die to implement. Thus, integrated circuit designers typically must struggle with compromises related to performance, available area, power consumption and product yield when designing clock signal distribution across a die.

Figure 1:
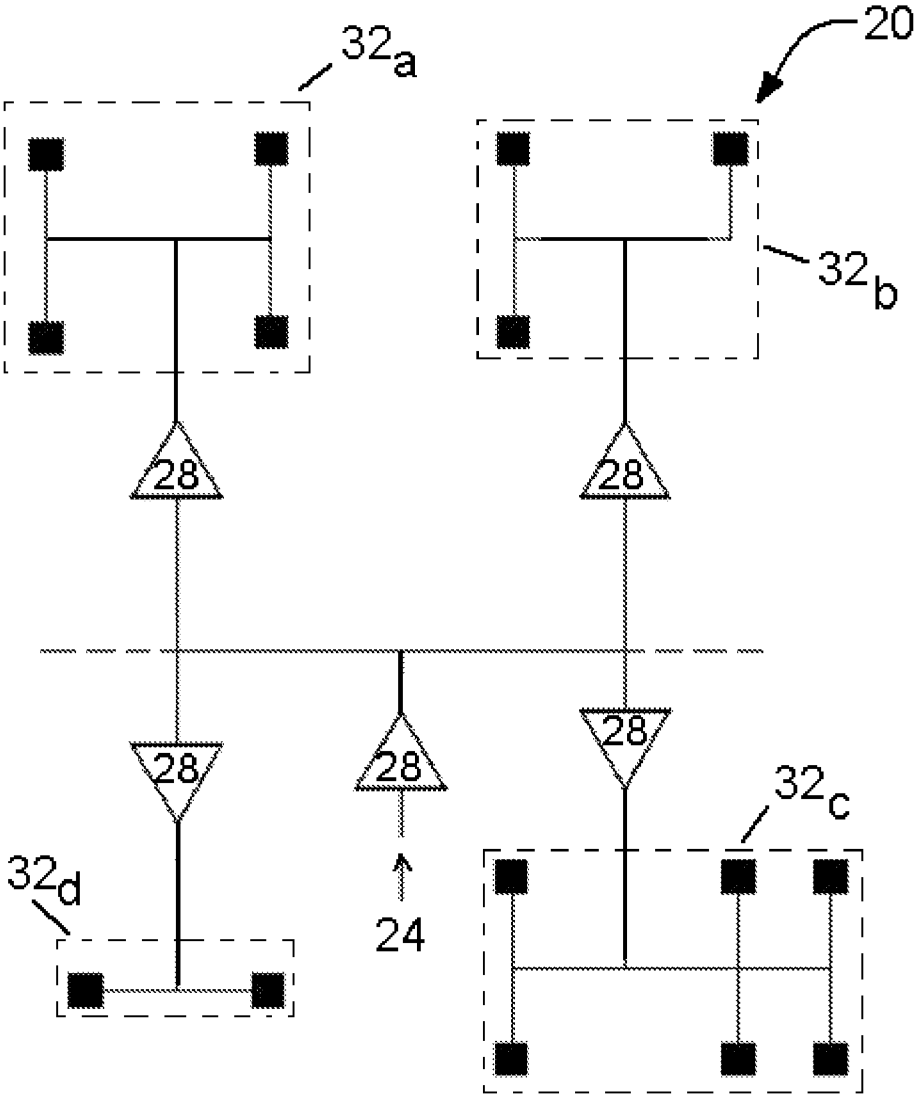
Fig. 1 (Prior Art)
FIG. 1 shows a schematic example of a prior art clock tree of an integrated circuit.

FIG. 1 illustrates an ideal example of a particular type of CT, called an H-tree clock distribution network, indicated generally at 20. In an H-tree, a clock signal 24 is input to a set of clock buffers 28 (which are often just simple inverters) which then distribute the clock pulses to various circuit components 32 as needed. While the ideal example of FIG. 1 seems a straightforward solution, in most actual complex integrated circuits, H-tree 20 would have to drive different sets of circuit components 32*a*, 32*b*, 32*c* or 32*d*, which can have large, uneven, distributed capacitive loads, at high switching frequencies. As a result, buffers 28 of varying strengths have to be designed into the H-tree (or other CT) to reliably drive the expected load of circuit elements 32 such as registers, latches and dynamic logic gates.

This requires circuit designers to estimate the capacitive load which will be applied to each buffer 28 and to then design each buffer 28 with sufficient capacity to service that estimated load. Providing buffers 28 with larger capacities requires more area on the die and consumes more power. Thus, designers must carefully balance needs to ensure adequate drive for the capacitive loads while avoiding the over-designing of buffers 28 and thus wasting die area and power.

Additionally, while clock skews can be reduced with an optimally designed H-Tree with appropriately sized and placed buffers, skews still cannot be eliminated. Further complicating this issue is the fact that manufacturing process variations when fabricating the integrated circuits can result in some circuit dies having clock trees operating in accordance with specifications while others, with the exact same design, fail post-manufacture testing—thus reducing the yield of the chips.

Further, a necessarily sophisticated CT implementation, such as a large H-tree, consumes a substantial fraction of the overall power expended in complex integrated circuits, and in some applications, the CT itself is responsible for a quarter, or more, of the total power consumption of the integrated circuit. As power consumption, and its associated issue of thermal management, are significant factors which limit designs, this is very problematic.

Yet a further challenge results from the fact that, ironically, while the CT plays a very important role in a synchronous sequential integrated circuit, its functionality is not generally capable of being directly observed for post-manufacture test purposes. A poorly designed CT may lead to circuit failures due to timing errors which are extremely difficult to debug. Unfortunately, the distributed nature of the CT and the sheer complexity of its design can also lead to intermittent failures that result in poor yield and/or reliability of integrated circuits and these problems have been exacerbated as circuit densities and die sizes have increased.

A known attempt to deal with some of these issues is to employ active and/or passive clock de-skewing circuits. However, closed loop de-skewing techniques also consume valuable and limited die area and consume significant amounts of power and require a non-trivial design effort.

All manufactured integrated circuits need to be post-manufacture tested for specification compliance. Testing and qualification of integrated circuits is typically done in several stages, and can be expensive and time consuming, significantly adding to the overall cost of manufacturing the integrated circuit.

During the test process, locations can be identified on the integrated circuit being tested where the circuit timing margins do not meet specifications, resulting in failures of the integrated circuit, or requiring the integrated circuit to be sold with a degraded operating speed or functionality. Currently it is not technically/economically viable to repair such integrated circuits.

Sometimes, designers of integrated circuits will add additional circuits to improve the timing margins. These techniques include the aforementioned active de-skewing circuits, or programmable buffers with non-volatile memory elements, etc. However, all these known techniques must be incorporated early in the design process for the integrated circuit and thus cannot address timing issues which are determined after a design is completed. Also, as mentioned above, such techniques require otherwise valuable die area and add to the power consumption of the integrated circuit. Designers therefore attempt to only employ such solutions where they anticipate timing issues will arise. Thus, the design process requires best effort estimates by the designers, speculating where timing margins may be compromised, and potentially leading to over provisioning of buffers, etc. wasting die area and power, or to a failure of the device under test to meet specifications.

The present inventor has determined that remediation of integrated circuits, to correct design and fabrication issues such as clock skew or other errors, can be performed after principal manufacture has been completed. Specifically, as disclosed herein, remediation of an integrated circuit to address such clock skew or other issues can be performed after MOS transistor-based logic circuitry has been formed on the integrated circuit die.

As is known, conventional fabrication processes for integrated circuits are divided into Front End Of Line ("FEOL") stages, wherein circuitry based on MOS transistors are formed on a first plane of the die, Back End Of Line ("BEOL") stages, where other features and requirements such as metal layers and insulation layers, etc. are added to another plane of the die, typically over the first plane, to complete the integrated circuit and Middle of Line ("MOL") stages between the FEOL and BEOL stages wherein other processes are performed.

In the present invention, remediation circuitry (discussed further below) can be added to an integrated circuit, with identified or potential issues by the provision of devices which are fabricated during the MOL or BEOL stages of device fabrication. Such devices are disclosed in published PCT application WO 2023/285936 to Barlage et al. and in published PCT application WO 2023/285951 to Barlage and Shoute, and such devices are herein referred to as "alternate plane" ("AP") transistors, as they are fabricated on planes of the semiconductor die which are over or under the plane of the die on which conventional devices are fabricated in the FEOL manufacturing stages.

Figure 2:
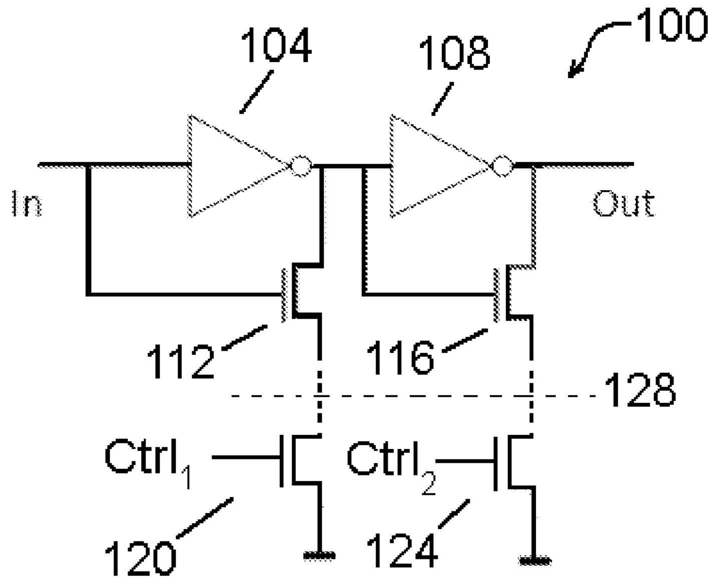
FIG. 2 shows a schematic of a buffer for use in an integrated circuit in accordance with an aspect of the present invention; and FIG. 3*a* and FIG. 3*b* shows schematics of two variants of the buffer of FIG. 2.

FIG. 2 shows a schematic representation of an example of a remediation technique to address failures, or issues, with clock skew. In FIG. 2, a novel buffer is indicated generally at 100 and, in this example buffer 100 serves as a clock buffer. Buffer 100 comprises two inverters 104 and 108, the output of inverter 104 being applied to the input of inverter 108 in a manner similar to conventional clock and other signal buffers. However, each inverter 104 and 108 is further paired with a respective MOS transistor 112 and 116. It is contemplated that inverters 104 and 108, and their corresponding MOS transistors 112 and 116 are fabricated on the integrated circuit die in FEOL stages, along with the logic circuitry they supply the clock to.

MOS transistors 112 and 116 each have a respective control transistor 120 and 124, which are AP transistors fabricated during MOL and/or BEOL stages of manufacture (indicated by dashed line 128 in FIG. 2). It is also contemplated that control transistors 120 and 124 can be formed as active vias, if desired.

In operation of clock buffer 100, when control signal $CTRL_1$ is applied to AP transistor 120, the rise time of the positive-going edge of the clock signal output from buffer 100 can be reduced proportionally to the strength of the combination of transistors 112 and 120. Similarly, when control signal $CTRL_2$ is applied to AP transistor 124, the fall time of the negative going edge of the clock signal output from buffer 100 is reduced proportionally to the strength of the combination of transistors 116 and 124.

As will be apparent, either or both of control signals $CTRL_1$ and $CTRL_2$ can be applied to buffer 100 as required to ensure the clock signal from buffer 100 has the required timing/strength for the circuits it drives. When control signals $CTRL_1$ and/or $CTRL_2$ are not applied to AP transistors 120 and/or 124, no power is consumed by MOS transistors 112 and 116. Only if one or both of control signals $CTRL_1$ and $CTRL_2$ are applied does buffer 100 draw any additional power.

As will be apparent to those of skill in the art, it is contemplated that in most cases control signals $CTRL_1$ and $CTRL_2$ will be DC signals, but it is also contemplated that, in some circumstances, either or both of control signals $CTRL_1$ and $CTRL_2$ can be toggled at a desired frequency, either by a square wave or a pulse width modulated (PWM) signal. In these latter cases, output capacity can be provided to buffer 100 on an intermittent basis, as needed.

Figure 3A:
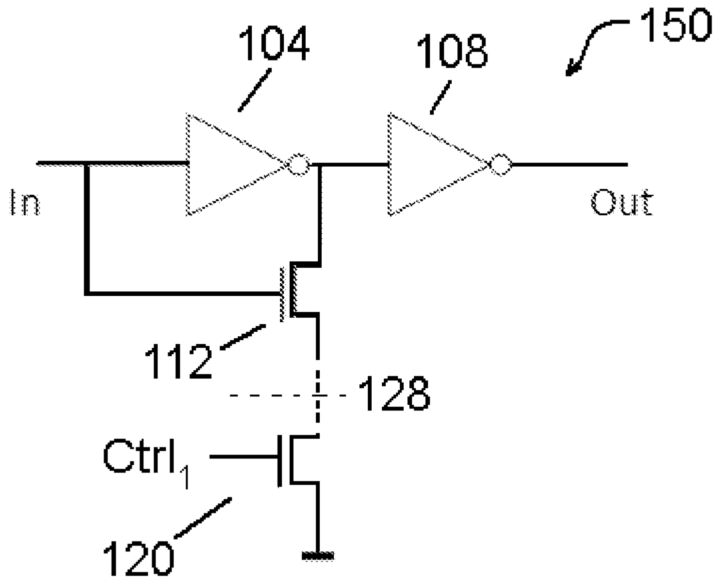
Figure 3B:
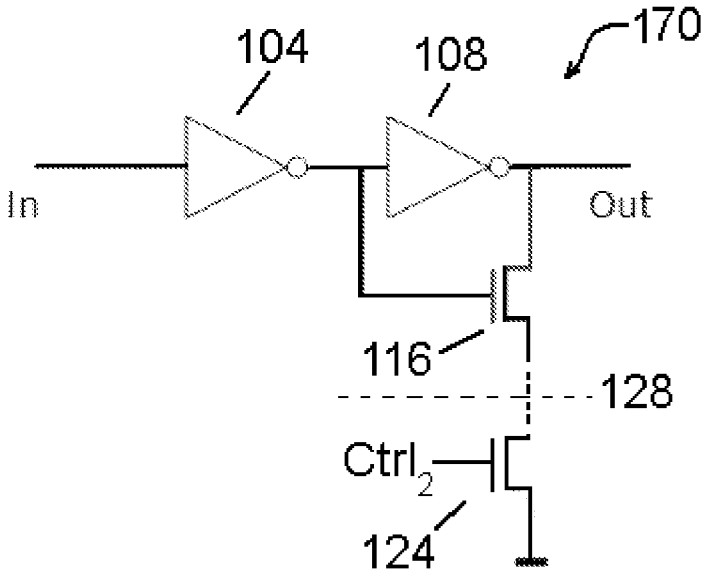

If a region of a circuit design only responds to one side (positive going or negative going) of the clock signal, then the design of clock buffer 100 can be simplified, by removing the unnecessary circuitry to reduce the required die area on the plane of the logic circuitry. FIG. 3*a* shows such a clock buffer 150 for the case where the logic circuitry receiving the clock signal is not responsive to the negative going side of the clock signal and FIG. 3*b* shows a clock buffer 170 for the case where the logic circuitry receiving the clock signal is not responsive to the positive going side of the clock signal.

Thus, buffers 100, 150 and/or 170 allow the designer of an integrated circuit to provide additional capacity to clock buffers that are contemplated as perhaps requiring additional strength without incurring an additional, fixed, amount of power consumption. In some cases, wherein the designer's estimates of required clock buffer capacity were overly optimistic, $CTRL_1$ and/or $CTRL_2$ for one or more buffers 100 can be asserted for all manufactured instances of a device, thus providing a remedial design "correction". In other cases, post-manufacture testing may determine that due to process variations, or other effects, some identified devices require $CTRL_1$ and/or $CTRL_2$ to be asserted to ensure correct operation of the device. As will be apparent, the additional power consumption (and the related increase in thermal issues) is only incurred if, during post-manufacture testing, it is determined that additional capacity is required at the output of buffers 100, 150 and/or 170.

In this manner, the designer of a complex integrated circuit can provide a level of additional potential buffer capability in their design and can selectively activate that additional capacity if and only if, it is subsequently determined that the additional buffer capability is required. A complex integrated circuit may have many instances wherein additional potential buffer capacity is provided and thus tens, hundreds or even more instances of additional potential buffer capacity can be provided as desired. By employing AP transistors, the die area of the plane on which the MOS logic circuitry is fabricated is minimally affected by the use of buffers 100, 150 and/or 170.

As mentioned above, in some cases, this additional buffer capacity may be required on all integrated circuits due to a design error (optimistic estimate of clock load, etc.), but it is contemplated that, more commonly, this additional buffer capacity will only be required, as determined by post-manufacture testing, on some percentage of manufactured integrated circuits as a result of manufacturing process variations.

Specifically, depending upon the integrated circuit design and its fabrication, post production testing of the integrated circuits can determine that: a particular instance of additional buffer capability is not required (i.e.—the original design was appropriately sized and implemented); the original design was overly optimistic and some or all of the instances of additional buffer capability is always required; or process variations across the silicon wafer, etc. result in some instances of the integrated circuit requiring the activation of some instances of the additional potential buffer capacity, while others do not require it. In this latter case, as part of the test process, the appropriate control signals ($CTRL_1$ and/or $CTRL_2$) for each respective instance of additional potential buffer capacity can be enabled or disabled as determined to be necessary by the testing of the specific chip.

The provision of the control signals to turn on the additional potential buffer capacity can be accomplished in a variety of manners, as will be understood by those of skill in the art, such as by burning "fuses" on the integrated circuit, appropriately setting control bits in a SRAM circuit on the integrated circuit, etc.

Figure 4:
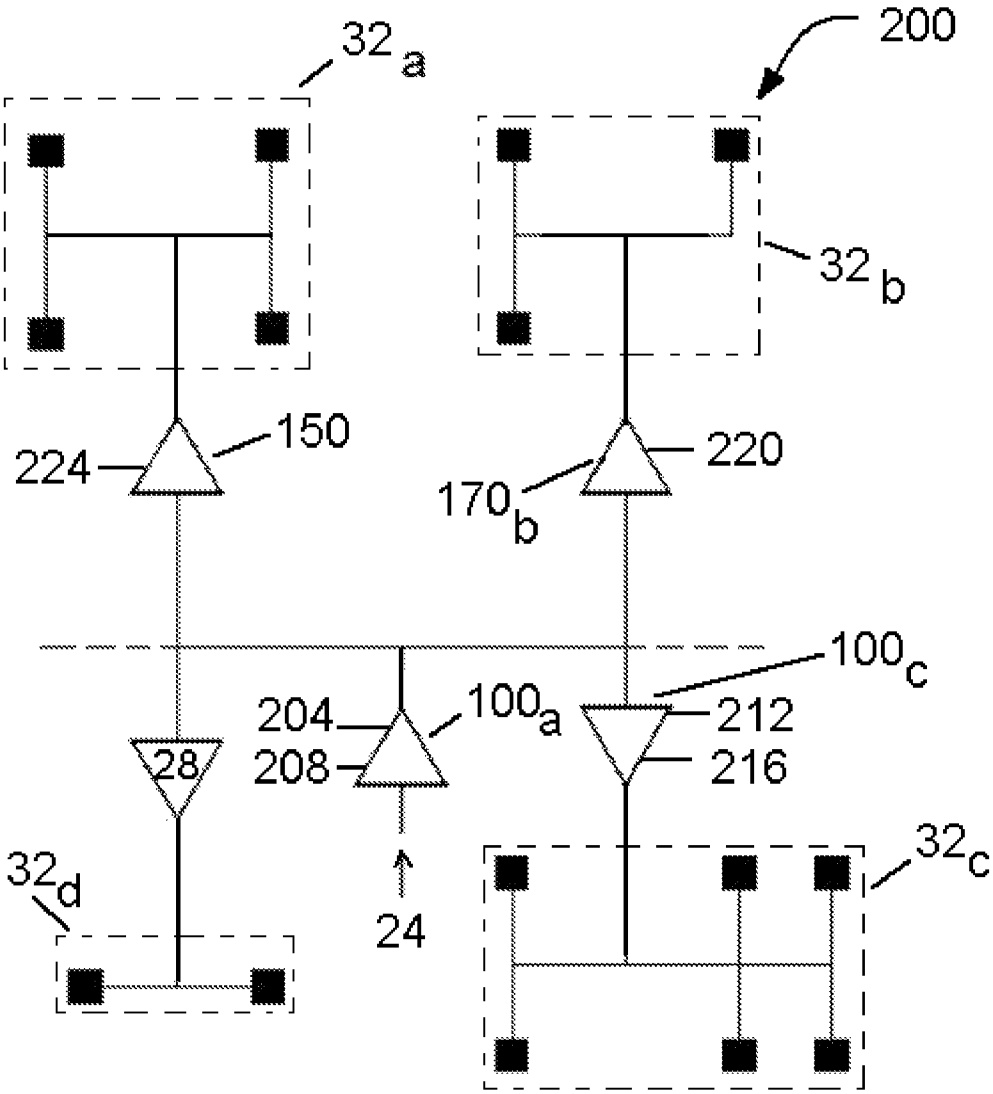
FIG. 4 shows a schematic example of a clock tree of an integrated circuit employing buffers in accordance with an aspect of the present invention.

FIG. 4 shows an H-tree clock distribution network which employs clock buffers 100, 150 and 170 in accordance with an aspect of the present invention. As illustrated, buffer *100a* to which clock input 24 is applied and which distributes the clock signal through the illustrated tree, can strengthen both the rising edge and the falling edge of the clock signal, as needed, and accordingly has input signals 204 and 208, which correspond to the $CTRL_1$ and $CTRL_2$ control signals, described above. In contrast, circuit elements *32b* are only responsive to the falling side of the clock signal and thus buffer *170b* has input 220 which corresponds to input $CTRL_2$ and buffer *170b* can strengthen the falling side of the clock signal if and as needed. Circuit elements *32c* have elements which respond to both the rising and falling sides of the clock signal and thus buffer *100c* can strengthen both sides of the clock signal and has inputs 212 and 216 corresponding to the $CTRL_1$ and $CTRL_2$ inputs to enable such strengthening, when necessary. The designer of the integrated circuit embodying clock tree 200 has determined that circuit elements *32d* can be appropriately clocked without requiring additional strengthening of the clock signal and thus are provided with their clock signal via a conventional buffer 28.

As will be apparent to those of skill in the art, by strengthening the rising and/or falling edges of the clock signals, the present invention is also addressing clock skew (i.e.—timing changes in when the rising or falling edges of the clock signal are detected.

Figure 5:
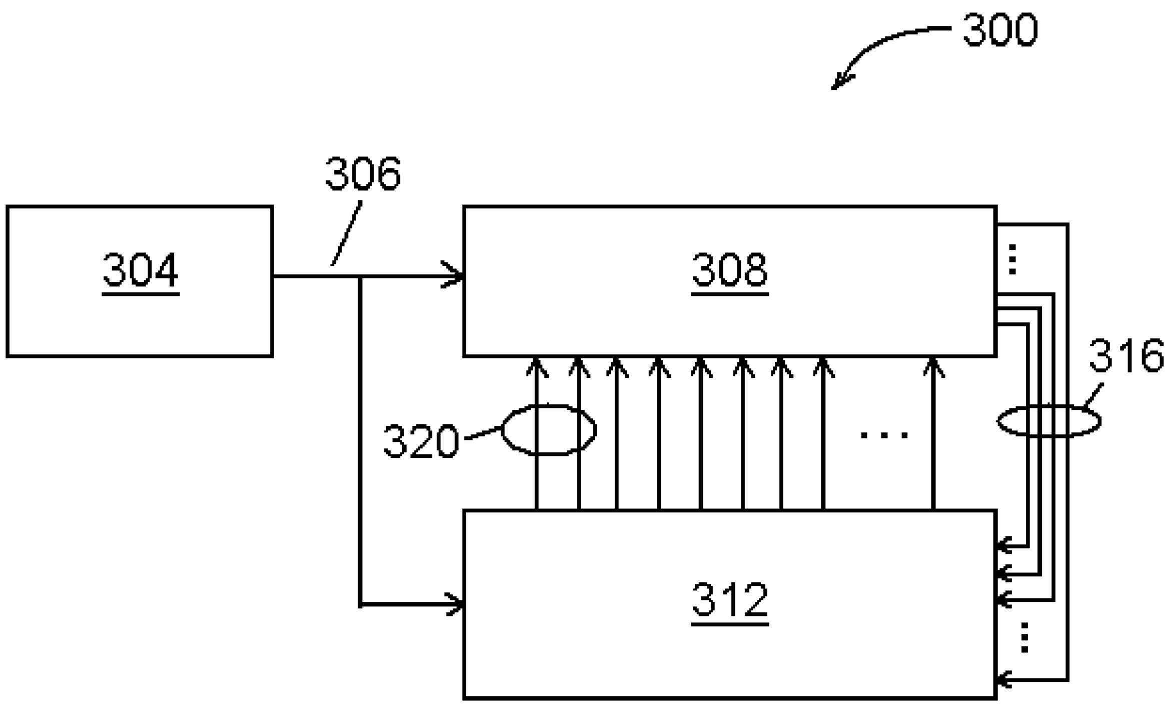
FIG. 5 shows a block diagram of a clock management system in accordance with an aspect of the present invention.

FIG. 5 shows an example of a clock management system 300 which can produce the $CTRL_1$ and/or $CTRL_2$ signals for each buffer 100, 150 and/or 170 to strengthen respective clock edges and/or to address clock skew as needed. As shown in the Figure, system 300 comprises a clock signal generator 304 which produces the clock signal 306 for the integrated circuit on which it is installed. Clock signal 306 is provided both to a clock distribution network 308, which can be an H-tree, Clock Mesh or other suitable distribution network, and to a clock management controller 312. Clock management controller 312, is connected to nodes of interest (i.e.—those which the chip designer desires to provide selectable strengthening to) in clock distribution network 308 clock and is provided with measures 316 of clock signals 306 from those nodes. In response to measures 316, clock management controller 312 produces appropriate $CTRL_1$ and/or $CTRL_2$ signals 320 to the appropriate instances of buffers 100, 15 and/or 170 on the integrated circuit.

Clock management controller 312 can be implemented in a variety of manners as will be apparent to those of skill in the art. For example, clock management controller 312 can include a set of "fuses" which are "blown" to enable $CTRL_1$ and/or $CTRL_2$ signals for respective buffers 100, 150 and/or 170 to address clock distribution issues identified by post-fabrication testing. Similarly, clock management controller 312 can include clock skew detection circuits, implemented by phase lock loop and/or by delay lock loop circuits, thermal sensors and/or other inputs to allow for the dynamic identification and subsequent correction of clock signal 306 by asserting relevant ones of the $CTRL_1$ and/or $CTRL_2$ signals.

Further, the present invention is not limited to use for addressing issues with clock signal levels and, instead, the present invention can be employed to address issues with a wide variety of control or other signals in complex integrated circuits. For example, high speed Input/Output (I/O) pins have become popular on modern chip designs to enable movement of large volumes of data into and out of the integrated circuits. Some instances of such I/O systems are popularly known as SERelizers and DESerilizers ("SERDES"). Current state-of-the-art SERDES and similar systems can boast more than 100 Gb/s data rates. At these speeds, optimizing timing so as to reduce the cross talk, bit error rate, etc. is very challenging.

Accordingly, such I/Os exploit signal processing, noise shaping and filtering techniques to mitigate aforementioned timing challenges. However, process variations when manufacturing such integrated circuits and non-ideal modeling/simulation during design of the relevant circuits can make the actual implementation of such high-speed signal processing circuits difficult. With the present invention sets of buffers, such as buffers 100 described above, can be integrated at key locations of the high speed I/O circuits to provide programmable levels of required or necessary output signal strengthening, as determined by testing of the actual completed integrated circuit. These buffers would be controlled, as a result of the post-manufacture testing of the I/O circuits, to provide the necessary signal levels for the specified operation of the I/O circuits. Thus, once a design is fabricated and the resulting manufactured instances of the integrated circuit are tested, the signals can be "tuned" to provide the necessary performance by activating or deactivating signal strengthening buffers 100.

It is contemplated that one of the key advantages of employing AP transistor-based circuits, as described above, is their ability to take corrective measures after all the FEOL MOS transistors are integrated, connected and their performance is tested.

Thus, as described above, it is contemplated that a structured approach to improving the yield of properly performing instances of integrated circuits can comprise the steps of: identifying areas of the design of an integrated circuit where it is believed that an issue might occur for the provision of signals, such as clock signals or other signals on the chip; providing additional potential buffering and/or output capacity at those identified locations, where that additional potential buffering capability can be selectively activated if required; testing each manufactured integrated circuit to determine if any tested performance issues fail due to inadequate performance of a signal where additional potential buffer capacity for that signal has been provided; and, if present, activating the additional potential buffer capacity to address the determined inadequate performance, thus increasing the number of integrated circuits which pass the test requirements, i.e.—the yield.

It is also contemplated that the use of AP transistor-based circuits can also be exploited to ensure the continued operation of integrated circuits which are deployed in the field. Specifically, all semiconductor integrated circuits can suffer varying degrees of reliability failures, over their lifetime, once deployed. These reliability failures are generally caused by various aging mechanisms, such as electro-migration, hot carriers, gate oxide damage, etc. to name just a few. Typically, these failures occur gradually and are often preceded by performance degradation. Higher on-chip current densities, high speed signal switching and high operating temperatures are major contributors to accelerate these aging and failure mechanisms. Therefore, high speed I/Os, clock networks, high speed on-chip bus drivers, etc. are readily susceptible to such failures.

With the use of AP transistor-based circuits, combined with devices provided in the FEOL MOS circuitry for redundancy and/or for buffering or other functions which can be activated programmatically, high-reliability architectures of circuit elements can be obtained. Such high-reliability circuit elements can include spare drivers, buffers and transistors that are enabled by AP transistors once an original driver starts to exhibit signs of aging/failure.

In preferred implementations of such high-reliability designs, non-volatile, programmable memory can be employed with the AP transistor-based circuits, such that the relevant circuit elements can be dynamically activated and/or deactivated in field. However, as will be apparent to those of skill in the art, such an architecture can also be deterministically programmed in the field by variety of mechanisms such as fuse, anti-fuse, and SRAM cells.

Therefore, an overall high-availability system can contain one or more AP transistor-based circuits, programmable devices and MOS circuits that can be employed to mitigate against reliability failures in chip circuits.

Another issue which can be addressed by the present invention is that of effective power delivery. Implementing power delivery systems on state-of-the-art integrated circuits with billions of transistors is another complex and challenging problem and a poorly designed power delivery network can cause power voltage droop, power supply noise, etc. Such power delivery issues can lead to intermittent failures that are difficult, or impossible, to debug and can cause timing-based and other failures.

To address noise in power supply designs, conventional integrated circuit designs utilize a large fraction of on-chip area to implement de-coupling capacitors to reduce such power supply noise and the design of these noise reduction and distribution systems requires a significant design effort.

In the manufacture of conventional integrated circuits, the measurement and characterization of power supply noise is one of the test parameters an integrated circuit will commonly have to pass. If, despite the efforts of the designers, the tested power supply noise level is unacceptably high in a given integrated circuit, that integrated circuit is typically discarded resulting in a lower yield for the production run.

With the present invention, AP transistors and related devices such as filter capacitors can be subsequently integrated onto a BEOL or MOL plane, after test and characterization of preliminary manufactured instances of an integrated circuit, to remedially augment any circuit areas which the testing has indicated have inadequate power delivery. By employing AP transistors and devices, it is not required redesign the FEOL logic circuitry of the integrated circuit, no the related masks and other tools used to manufacture that FEOL logic circuitry. It is believed that this is a significant advantage of the present invention.

Figure 6:
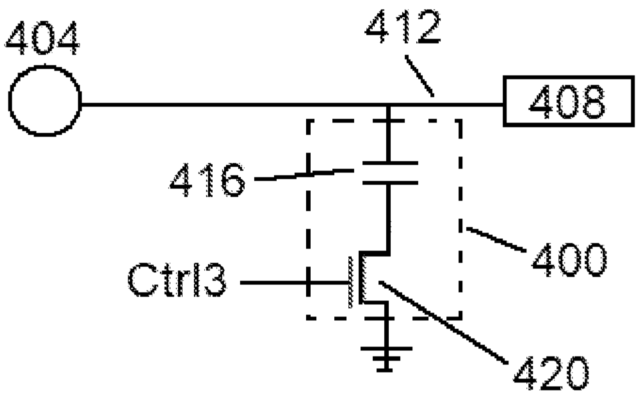
FIG. 6 shows a power supply decoupler in accordance with an aspect of the present invention.

It is also contemplated that power supply issues can be address dynamically, in a fashion similar to that discussed above for clock signals. Specifically, FIG. 6 shows an example of a programmable power supply decoupler 400. In the example, a load 404 is connected to a power supply 408 via a power supply lead 412 and power supply decoupler 400 is connected to power supply lead 412, preferably close to load 408. Power supply decoupler 400 includes a capacitor 416 and an AP transistor 420 which is controlled by a signal $CTRL_3$ applied to its gate. Capacitor 416 can be formed with the MOS circuitry formed in FEOL processed, but more preferably is formed through MOL and/or BEOL processes on another plane of the integrated circuit. In such a case, power supply decoupler 400 will occupy little, if any, of the die area on which the FEOL MOS devices are fabricated.

As will be apparent to those of skill in the art, capacitor 416 can be switched into or out of the power supply circuit formed between supply 404 and load 408 by asserting or removing the $CTRL_3$ signal, to filter noise and/or to inhibit spikes or drop outs on power lead 412.

It is contemplated that, in many cases, capacitor 416 can be shared by several instances of power supply decoupler 400, any or all of which can be activated or inactivated as needed for a particular integrated circuit. Similar to the $CTRL_1$ and $CTRL_2$ signals discussed above, the $CTRL_3$ signal for each power supply decoupler 400 can be produced in any suitable manner and can be set dynamically (as needed) by a power management system which monitors power supply performance at relevant part of the integrated circuit or permanently (by fuse, or anti-fuse devices, etc.) after post-manufacturing testing has determined one or more problem areas on the manufactured integrated circuit under test.

In another aspect of the present invention, it is often the case that it is desired to tailor an otherwise large-volume integrated circuit for specific application domains. Conventionally, this has required various versions of the base architecture to be created and manufactured. For example, a microprocessor can be optimized for desk top, laptop, or server applications. Even within these specific domains, it is known to create a number of variants to cater to various market segments, such as low cost consumer devices, industrial use cases, server applications, etc.

In a conventional integrated circuit manufacturing process, various designs variants are created that require different sets of expensive masks, different test regimes, etc. In contrast, with the present invention the integrated circuit can be manufactured with an architecture of traditional MOS transistors supplemented by AP transistors that can have in-field, or during the test phase, programmability capability which can activate or deactivate features on the integrated circuit to achieve a desired variant. Thus, a single integrated circuit can be designed, manufactured and tested, reducing manufacturing costs such as the requirement for additional mask sets and/or testing systems, while still allowing the manufacturer to sell multiple variants.

Further, it is contemplated that should a manufactured integrated circuit fail a test which is relevant to a performance requirement for one variant (e.g.—a high speed server variant), the integrated circuit can programmatically be reconfigured, via the AP transistors, to a variant (e.g.—a desktop computer processor) wherein the failed test is not relevant to the successful performance of that variant.

For example, a server variant may specify a certain number of operable processor cores, while a desktop variant may specify fewer cores. If a particular manufactured integrated circuit has one or more cores fail testing, the failed cores can be deactivated by the AP transistors, and effectively removed from the integrated circuit, allowing that integrated circuit to reconfigured as another variant, such as a desktop computer variant which is intended to have and, is offered with, a reduced number of processing cores. In such a case the AP transistors can, for example, disable the power supplied to the core to be disabled. Such a capability will lead to an effectively increased yield as more manufactured devices can be sold, albeit perhaps at a lower price.

Figure 7:
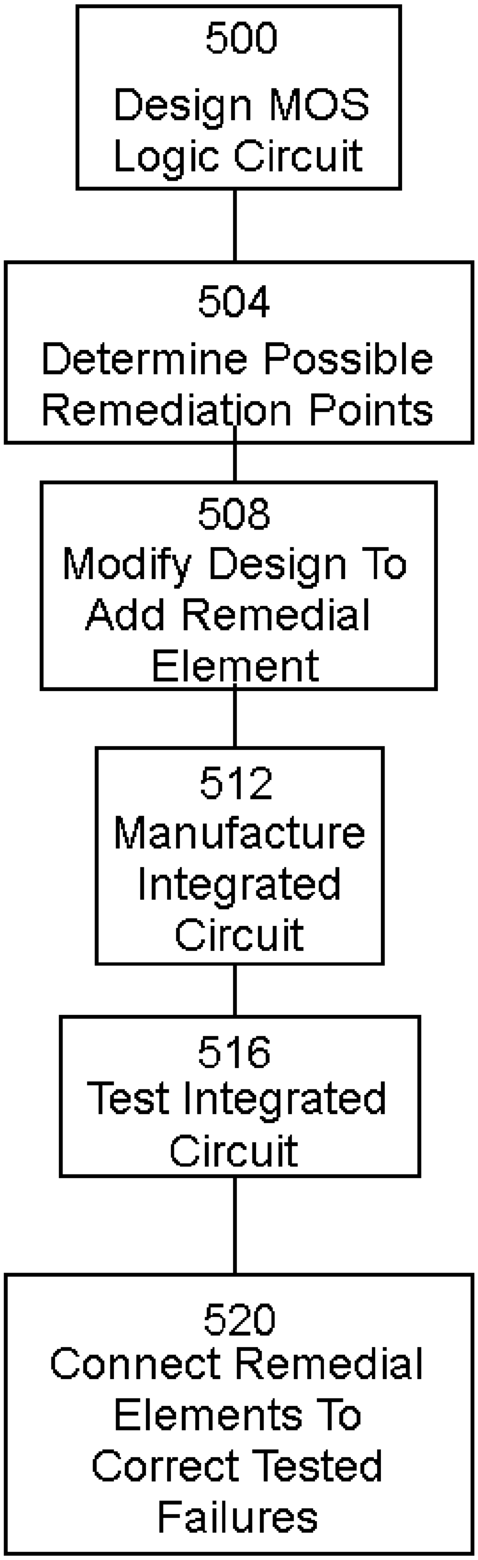
FIG. 7 shows a flowchart of a method in accordance with an aspect of the present invention.

FIG. 7 shows a flowchart of a method in accordance with an aspect of the present invention. The method starts at step 500, wherein a MOS logic circuit is designed. At step 504, points of the designed circuit which may require remediation are identified. This identification can be performed by a review of the design using simulation tools, a designer led review, etc., or by manufacturing a "first silicon" run of integrated circuits using the design and then testing instances of that first silicon run to identify areas which may require remediation.

At step 508, the design of the integrated circuit is modified to include remediation elements at the points determined in step 504. At step 512, instances of integrated circuits using the design, as modified at step 508, are manufactured.

At step 516, instances of the integrated circuits manufactured at step 512 are tested to identify points in the circuit wherein it is desired to activate the remediation elements and, at step 520, the remediation elements at those identified points are connected to the MOS logic circuitry of the integrated circuit.

While the method of FIG. 7 is directed to improving the yield of manufactured integrated circuits through post-manufacture verification and remediation, as is described above the present invention can also be employed to correct failures and faults in integrated circuits which are in use. Specifically, steps 516 and 520 can be performed dynamically when an integrated circuit is in use to remediate issues and failures which arise due to aging, environmental conditions, etc.

The above-described embodiments of the invention are intended to be examples of the present invention and alterations and modifications may be effected thereto, by those of skill in the art, without departing from the scope of the invention which is defined solely by the claims appended hereto.

I claim:

1. A system for increasing the yield of manufactured integrated circuits, each integrated circuit comprising:

a designed set of circuits implemented as front end of line manufactured circuit elements, including at least two remedial front end of line circuit elements that are configured to remediate operation of at least one of the front end of line manufactured circuit elements, the at least two remedial front end of line circuit elements comprising a clock buffer to strengthen a signal at the at least one of the front end of line manufactured circuit elements;

at least two alternate plane transistors, the at least two alternate plane transistors operable to selectively activate or deactivate, post manufacture of the integrated circuit, the at least two remedial front end of line circuit elements in accordance with a result of a test performed on the integrated circuit, wherein a first one of the at least two alternate plane transistors is operable to selectively activate or deactivate a first one of the at least two remedial front end of line circuit elements to increase the speed of the rising edge of the clock signal through the clock buffer and a second one of the at least two alternate plane transistors is operable to selectively activate or deactivate a second one of the at least two remedial front end of line circuit elements to increase the speed of the falling edge of the clock signal through the clock buffer.

2. The system of claim 1 further including a programmable element to control the selective activation and deactivation of the at least two remedial front end of line circuit elements.

3. The system of claim 1 wherein the at least two alternate plane transistors are operable to selectively activate or deactivate, post manufacture of the integrated circuit, the at least two remedial front end of line circuit elements in accordance with the result of the test as indicated by a dynamic signal generated at the designed set of circuits.

4. The system of claim 1 wherein the at least two remedial front end of line circuit elements further comprise an additional buffer to strengthen an output signal.

5. The system of claim 1 wherein the at least two alternate plane transistors are back end of line transistors or middle of line transistors.

6. A system for increasing the yield of manufactured integrated circuits, each integrated circuit comprising:

a designed set of circuits implemented as front end of line manufactured circuit elements, including at least one remedial front end of line circuit element that is configured to remediate operation of at least one of the front end of line manufactured circuit elements, the at least one remedial front end of line circuit element comprising a buffer to strengthen a signal at the at least one of the front end of line manufactured circuit elements, and the at least one remedial front end of line circuit element further comprising an additional strengthening buffer for an input/output signal;

at least one alternate plane transistor, the at least one alternate plane transistor operable to selectively activate or deactivate, post manufacture of the integrated circuit, the at least one remedial front end of line circuit element in accordance with a result of a test performed on the integrated circuit.

7. The system of claim 6, wherein the buffer is a clock buffer.

8. The system of claim 6, further including a programmable element to control the selective activation and deactivation of the at least one remedial front end of line circuit element.

9. The system of claim 6, wherein the at least one alternate plane transistor is operable to selectively activate or deactivate, post manufacture of the integrated circuit, the at least one remedial front end of line circuit element in accordance with the result of the test as indicated by a dynamic signal generated at the designed set of circuits.

10. The system of claim 6, wherein the at least one alternate plane transistor is a back end of line transistor or a middle of line transistor.

11. A method of increasing the yield when manufacturing integrated circuits, comprising the steps of:

designing a MOS logic integrated circuit, the MOS logic integrated circuit comprising a designed set of circuits implemented as front end of line manufactured circuit elements and at least two alternate plane transistors;

determining at least one possible point of circuit failure in the designed MOS logic integrated circuit;

modifying the design of the MOS logic integrated circuit by adding at least two remedial front end of line circuit elements to the design of the MOS Logic integrated circuit at the determined at least one possible point of failure, the at least two remedial front end of line circuit elements to be located on a plane of the MOS logic integrated circuit other than a plane of the MOS Logic integrated circuit on which the MOS logic is located, the at least two remedial front end of line circuit elements configured to remediate operation of at least one of the front end of line manufactured circuit elements, and the at least two remedial front end of line circuit elements comprising a clock buffer to strengthen a signal at the at least one of the front end of line manufactured circuit elements;

manufacturing the MOS logic integrated circuit using the modified design;

testing the manufactured integrated circuit to determine if the at least one possible point of failure is a point of failure to detect if the at least one possible point of failure is a point of failure; and connecting the at least two remedial front end of line circuit elements to the determined point of failure in the manufactured MOS logic through at least two alternate plane transistors to correct the failure, a first one of the at least two plane transistors configured to selectively activate or deactivate, post manufacture of the MOS logic integrated circuit, a first one of the at least two remedial front end of line circuit elements in accordance with a result of the testing performed on the integrated circuit to increase the speed of the rising edge of the clock signal through the clock buffer and a second one of the at least two alternate plane transistors is configured to selectively activate or deactivate a second one of the at least two remedial front end of line circuit elements to increase the speed of the falling edge of the clock signal through the clock buffer.

12. The method of claim 11 wherein the at least two alternate plane transistors are formed on the plane of the MOS logic integrated circuit other than a plane on which the MOS logic is located.

13. The method of claim 12 wherein the at least two alternate plane transistors connect the at least two remedial front end of line circuit elements in response to a dynamic signal.

14. The method of claim 13 wherein the dynamic signal is provided responsive to a measured function of the operating MOS logic circuit.

15. The method of claim 14 wherein the dynamic signal is provided by a clock management system including at least one of a phase locked loop and a delay lock loop.

16. The method of claim 12 wherein the at least two remedial front end of line circuit elements are decoupling capacitors.

17. The method of claim 12 wherein the at least two remedial front end of line circuit elements further comprise an additional buffer to strengthen an output signal.

18. A system for increasing the yield of manufactured integrated circuits, each integrated circuit comprising:

a designed set of circuits implemented as front end of line manufactured circuit elements, including at least one remedial front end of line circuit element that is configured to remediate operation of at least one of the front end of line manufactured circuit elements, the at least one remedial front end of line circuit element comprising a clock buffer;

at least one alternate plane transistor, the at least one alternate plane transistor operable to selectively activate or deactivate, post manufacture of the integrated circuit, the at least one remedial front end of line circuit element in accordance with a result of a test performed on the integrated circuit as indicated by a dynamic signal generated at the designed set of circuits, the dynamic signal is provided by a clock management system including at least one of a phase locked loop and a delay lock loop.

19. The system of claim 18, further including a programmable element to control the selective activation and deactivation of the at least one remedial front end of line circuit element.

20. The system of claim 18, wherein the at least one remedial front end of line circuit element further comprises an additional buffer to strengthen an output signal.

21. The system of claim 18, wherein the at least one alternate plane transistor is a back end of line transistor or a middle of line transistor.

22. A system for increasing the yield of manufactured integrated circuits, each integrated circuit comprising:

a designed set of circuits implemented as front end of line manufactured circuit elements, including at least one remedial front end of line circuit element that is configured to remediate operation of at least one of the front end of line manufactured circuit elements, the at least one remedial front end of line circuit element comprising a decoupling capacitor:

at least one alternate plane transistor, the at least one alternate plane transistor operable to selectively activate or deactivate, post manufacture of the integrated circuit, the at least one remedial front end of line circuit element in accordance with a result of a test performed on the integrated circuit.

23. The system of claim 22, wherein the at least one remedial front end of line circuit element comprises a buffer to strengthen a signal at the at least one of the front end of line manufactured circuit elements.

24. The system of claim 23, wherein the buffer is a clock buffer.

25. The system of claim 22, further including a programmable element to control the selective activation and deactivation of the at least one remedial front end of line circuit element.

26. The system of claim 22, wherein the at least one alternate plane transistor is operable to selectively activate or deactivate, post manufacture of the integrated circuit, the at least one remedial front end of line circuit element in accordance with the result of the test as indicated by a dynamic signal generated at the designed set of circuits.

27. The system of claim 22, wherein the at least one remedial front end of line circuit element further comprises an additional buffer to strengthen an output signal.

28. The system of claim 22, wherein the at least one alternate plane transistor is a back end of line transistor or a middle of line transistor.

* * * * *